(12) United States Patent
Eklund

(10) Patent No.: US 6,248,502 B1
(45) Date of Patent: Jun. 19, 2001

(54) DEVELOPER SOLVENT FOR PHOTOPOLYMER PRINTING PLATES AND METHOD

(75) Inventor: Richard W. Eklund, Winston-Salem, NC (US)

(73) Assignee: Nupro Technologies, Inc., Winston Salem, NC (US)

( * ) Notice: Subject to any disclaimer, the term of this patent is extended or adjusted under 35 U.S.C. 154(b) by 0 days.

(21) Appl. No.: 09/631,975

(22) Filed: Aug. 3, 2000

Related U.S. Application Data

(60) Division of application No. 09/224,994, filed on Jan. 4, 1999, which is a continuation-in-part of application No. 09/004,914, filed on Jan. 9, 1998, now abandoned.

(51) Int. Cl.[7] ........................................ G03F 7/30
(52) U.S. Cl. ................................ 430/300; 430/331
(58) Field of Search ..................... 430/300, 331

(56) References Cited

U.S. PATENT DOCUMENTS

| | | |
|---|---|---|
| 3,791,828 | 2/1974 | Moore et al. . |
| 3,867,526 | 2/1975 | Hennart et al. . |
| 4,177,074 | 12/1979 | Proskow . |
| 4,323,636 | 4/1982 | Chen . |
| 4,323,637 | 4/1982 | Chen et al. . |
| 4,369,246 | 1/1983 | Chen et al. . |
| 4,423,135 | 12/1983 | Chen et al. . |
| 4,517,279 | 5/1985 | Worms . |
| 4,806,452 | 2/1989 | Hoffmann et al. . |
| 4,847,182 | 7/1989 | Worms et al. . |
| 5,041,360 * | 8/1991 | Schlosser ........................ 430/309 |
| 5,061,606 | 10/1991 | Telser et al. . |
| 5,552,379 | 9/1996 | Winter et al. . |
| 5,580,848 | 12/1996 | Drapier . |
| 5,630,847 | 5/1997 | Roetker . |
| 5,663,134 | 9/1997 | Trinh et al. . |

FOREIGN PATENT DOCUMENTS 1358062   6/1974   (GB) .

* cited by examiner

*Primary Examiner*—Hoa Van Le
(74) *Attorney, Agent, or Firm*—Blank Rome Comisky & McCauley LLP

(57) ABSTRACT

Flexographic printing plates crosslinkable by photopolymerization are produced by exposing the plates to a light source and washing out (developing) with a solvent the non-crosslinked areas that are masked out during the exposure process. The invention provides terpene ester-based solvents suitable for use in the development of photopolymer printing plates. The solvents, which include terpene esters alone or terpene esters mixed with organic solvents and/or non-solvents, are effective in developing a a large number of different photopolymer printing plates and can produce images superior to those obtained with commercially available solvents currently used in such applications.

15 Claims, No Drawings

DEVELOPER SOLVENT FOR PHOTOPOLYMER PRINTING PLATES AND METHOD

This is a divisional application of Ser. No. 09/224,994, filed Jan. 4, 1999, which is a continuation-in-part application of Ser. No. 09/004,914, filed Jan. 9,1998. NOW ABN

FIELD OF THE INVENTION

The present invention relates to an improved solvent and process for the production of flexographic printing plates crosslinked by photopolymerization. More specifically, the invention relates to a solvent system using terpene esters, alone or in combination with co-solvents, as washout solvents for the unpolymerized material in the printing plates to develop a relief image and a method for developing printing plates.

BACKGROUND OF THE INVENTION

Washout processes for the development of photopolymerizable flexographic printing plates are well known. Ordinarily, exposed plates are washed (developed) in a solvent which can remove the unpolymerized material while leaving the polymerized (cured) material intact. The developers typically used in such processes include: (a) chlorohydrocarbons, such as trichloroethylene, perchloroethylene or trichloroethane, alone or in a mixture with a lower alcohol, such as n-butanol; (b) saturated cyclic or acyclic hydrocarbons, such as petroleum ether, hexane, heptane, octane, cyclohexane or methylcyclohexane; (c) aromatic hydrocarbons, such as benzene, toluene or xylene; (d) lower aliphatic ketones, such as acetone, methyl ethyl ketone or methyl isobutyl ketone; and (e) terpene hydrocarbons, such as d-limonene.

One important disadvantage of the known solvents and the procedures for their use is that the solvents being used as developers may act too slowly, cause swelling of the plates and/or cause damage to the fine detail in the plate by undercutting and/or pinholing. Moreover, when non-chlorinated solvents are used in the washout process, long drying times may be necessary. Furthermore, many of these solvents have flashpoints of less than 100 degrees F., so that the process can only be operated in special, explosion-protected plants. Many of the prior art solvents are considered Hazardous Air Pollutants (HAPS), and are subject to stringent reporting requirements. When chlorohydrocarbons and other toxic chemicals are used, their toxicity also gives rise to disposal problems and worker safety issues.

DESCRIPTION OF THE PRIOR ART

An essential step to any photopolymeric relief printing process is the development of the printing plate after the image is formed. Ordinarily, development is accomplished by washing the exposed plate in a solvent which can remove the unpolymerized material while leaving the polymerized (cured) material intact. Since such plates can be formed from a variety of materials, it is necessary to match a specific plate with an appropriate solvent. For example, U.S. Pat. Nos. 4,323,636; 4,323,637; 4,423,135; and 4,369,246, the disclosures of which are incorporated herein by reference, disclose a variety of photopolymer printing plate compositions based on block copolymers of styrene and butadiene (SBS) or isoprene (SIS). These compositions can be utilized to produce printing plates which can be developed by a number of aliphatic and aromatic solvents, including methyl ethyl ketone, toluene, xylene, d-limonene, carbon tetrachloride, trichloroethane, methyl chloroform, and tetrachloroethylene. These solvents may be used alone or in a mixture with a "non-solvent" (i.e. a material which cannot dissolve unpolymerized materials, for example, trichloroethane with ethanol). In any case, during the development step, the solvent can be applied in any convenient manner such as by pouring, immersing, spraying, or roller application. Brushing, which aids in the removal of the unpolymerized or uncrosslinked portions of the composition, can also be performed to facilitate the processing of the plate.

Similarly, British Patent No. 1,358,062 discloses photosensitive compositions consisting of a nitrile rubber with an addition of photopolymerizable tri- or tetra-unsaturated ester derived from acrylic or methacrylic acid combined with an addition polymerization initiator activated by actinic radiation. Plates made from this composition are processable by organic solvents including aliphatic esters such as ethyl acetate, aliphatic ketones such as acetone, methyl ethyl ketone, d-limonene, halogenated organic solvents, such as chloroform, methylene chloride, CFC 113 or blends of such solvents. Brushing or agitation can be used to facilitate the removal of the non-polymerized portion of the composition.

U.S. Pat. No. 4,177,074 discloses a photosensitive composition containing a high molecular weight butadiene/acrylonitrile copolymer which contains carboxyl groups, a low molecular weight butadiene polymer which may or may not contain carboxyl groups, and an ethylenically unsaturated monomer, combined with a free-radical generating system. This composition is also used as the polymer layer of a flexographic printing plate and requires processing with such organic solvents as methyl ethyl ketone, benzene, toluene, xylene, d-limonene, trichloroethane, trichlorethylene, methyl chloroform, tetrachloroethylene, or solvent/non-solvent mixtures, e.g., tetrachloroethylene and n-butanol. The composition may also be processed with water-soluble organic solvents in an aqueous basic solution, such as sodium hydroxide/isopropyl alcohol/water; sodium carbonate/isopropyl alcohol/water; sodium carbonate/2-butoxyethanol/water; sodium borate/2-butoxyethanol/water; sodium silicate/2-butoxyethanol/water; sodium borate/2-butoxyethanol/water; sodium silicate/2-butoxyethanol/glycerol/water; and sodium carbonate/2-(2-butoxyethoxy) ethanol/water.

U.S. Pat. No. 4,517,279, the disclosure of which is incorporated herein by reference, discloses a photosensitive composition containing a high molecular weight butadiene acrylonitrile copolymer which contains carboxyl groups, and a high molecular weight butadiene/acrylonitrile copolymer which does not contain carboxyl groups, combined with ethylenically unsaturated monomer and a free radical generating system. That composition, which is also used as the polymer layer of a flexographic printing plate, requires processing by blends of tetrachloroethylene and a non-solvent. The composition may also be processed in mixtures of sodium hydroxide/isopropyl alcohol/water; sodium carbonate/2-butoxyethanol/water; sodium silicate/2-butoxyethanol/water; sodium carbonate/2-butoxyethanol/glycerol/water; and sodium hydroxide/2-(2-butoxyethoxy) ethanol/water.

As can be seen from the foregoing examples of the prior art, the solvents needed for image development will vary depending on the composition of the polymer layer of the plate. The need for different solvent systems is particularly inconvenient, especially if different photopolymer systems are being processed at the same facility. Furthermore, many of the solvents used to develop the plates are toxic or suspected carcinogens. Thus, there exists a real need for solvent systems which can be used with a greater degree of safety. In addition, there exists a need for solvent systems which can be used in a variety of plates. U.S. Pat. Nos. 4,806,452 and 4,847,182, the disclosures of which are incorporated herein by reference, disclose solvent developers for flexographic plates containing terpene hydrocarbons such as d-limonene which are effective on a variety of plate types. These terpene hydrocarbon-based developers are also non-toxic. However, they have proven to be hazards in the workplace because of their tendency to spontaneously combust thereby causing fires. The terpene hydrocarbons also have low flash points compared to the terpene esters, e.g., the flash point of d-limonene (tag closed cup method (TCC)) is 120° F., whereas the flash point of terpinyl acetate (TCC) is >200° F. which increases the safety of the terpene esters.

SUMMARY OF THE INVENTION

The present invention comprises solvents for use in the processing of a wide variety of photopolymeric materials used to form photopolymer printing plates. These solvents, which comprise terpene esters either alone or in the presence of other organic materials (solvents and non-solvents), can be used with SBS and SIS polymer systems, as well as a large number of nitrile rubber and other copolymer systems. The terpene esters are natural products with low toxicity and are relatively safe to use compared with other solvent systems. Such solvents, it has been discovered, provide a unique combination of reduced cost, improved plate quality, low volatility, improved regulatory compliance, low toxicity and biodegradability.

OBJECTS OF THE INVENTION

It is an object of the present invention to provide a solvent system and a process for the preparation of relief plates crosslinked by photopolymerization, in which the washout time and the drying time are substantially shorter compared with the conventional process solvents, and wherein the relief plates suffer neither excessive surface swelling nor under-washing and are characterized by improved relief depths and sidewall structure.

Another object of the present invention is to provide a process for the preparation of relief plates crosslinked by photopolymerization which is capable of operation without expensive explosion protection.

It is another object of the present invention to provide solvent systems for use with photopolymeric printing plates which overcome the spontaneous combustion problems of the prior art solvent systems.

It is another object of the present invention is to provide solvent systems which minimizes workplace hazards and requires minimal regulatory reporting.

DESCRIPTION OF THE PREFERRED EMBODIMENTS

The present invention comprises terpene ester solvents for use in photopolymer printing plate processing. The terpene esters, which can be used either alone or in a blended form with co-solvents or non-solvents, can be used to develop a number of different photopolymer printing plates. A wide variety of terpene esters are suitable for use in the solvents of this invention including, but not limited to, terpinyl acetate, terpinyl formate, isobornyl acetate, isobornyl formate, fenchyl acetate, linalyl acetate, citronellyl acetate and geranyl acetate.

Mixtures of terpene esters can also be used and may show synergistic effects when compared with a terpene ester used alone. When a combination of two or more terpene esters is used, the resulting blend is often more effective as a solvent than the individual terpene esters. This blend is referred to herein as a TME (Terpene Mixed Ester) solvent.

The mixture of terpene esters can be varied but a suitable mixture is about 35–65% by weight terpinyl ester is mixed with about 15–45% by weight fenchyl ester and about 10–35% by weight linalyl ester. A preferred mixture is about 40–60% by weight terpinyl ester is mixed with about 20–40% by weight fenchyl ester and about 15–30% by weight linalyl ester and an ever more preferred mixture is about 45–55% by weight terpinyl ester is mixed with about 25–35% by weight fenchyl ester and about 15–25% by weight linalyl ester. The preferred carboxylic acids used to form the esters of the terpene alcohols are formic, acetic, propionic and butyric acids and with the preferred carboxylic acid being acetic acid.

Other solvents and non-solvents can also be employed with the terpene esters and terpene mixed esters according to the invention. Suitable co-solvents include n-butanol, 2-ethoxyethanol, benzyl alcohol, ethanol, methanol, propanol, isopropanol, alpha terpineol, dipropylene glycol methyl ether, 2-butoxyethanol, isopropyl alcohol, and 2-(2-butoxyethoxy) ethanol. The co-solvent should be soluble in the terpene ester or mixture of terpene esters, have suitable dissolving properties towards the non-photolysed portions of the plate that are to be dissolved, have acceptable toxicity and safety profiles and be readily disposable. The co-solvents are used to modify the properties of the solvent blend. This includes, for example, the addition of co-solvents to aid in the removal of the top protective cover layer on the flexographic plate. In addition, several of the co-solvents such as terpene alcohols, in particular alpha terpineol, serve as stabilizers to prevent the separation of the solvent blend, which can occur at reduced temperatures. This stabilizer property of the co-solvent becomes important when isoparaffinic hydrocarbons are used as the non-solvent and benzyl alcohol is used as a co-solvent to remove the outer layer of the photopolymerizable plate since the benzyl alcohol has a tendency to separate from the terpene esters and paraffinic hydrocarbon mixture.

The non-solvent should be miscible with the terpene ester or terpene esters and the co-solvents, should have acceptable toxicity and safety profiles and should be readily disposable. Suitable non-solvents include petroleum distillates, such as aliphatic petroleum distillates, naphthas, paraffinic solvents, hydrotreated petroleum distillates, mineral oil, mineral spirits, ligroin, decane, octane, hexane and other similar materials. Isoparaffinic solvents are commercially available in a wide range of volatility and corresponding flash points. The washout solution of the invention can made with a wide range of commercially available isoparaffinic solvents as its non-solvent base.

The following table illustrates the volatility/flashpoint data of commercially available isoparaffinic solvents suitable for use as non-solvents in the washout solutions of the invention.

| VOLATILITY | | | | | |
|---|---|---|---|---|---|
| Flash Point ° C. (° F.) | 41 (106) | 54 (129) | 57 (135) | 64 (147) | 91 (196) |
| Distillation ° C. (° F.) | 160 (320) | 178 (352) | 177 (350) | 191 (376) | 223 (433) |

-continued

| VOLATILITY | | | | | |
|---|---|---|---|---|---|
| Initial Boiling Point | | | | | |
| 50% Dry Point °C. (°F.) | 166 (331) 174 (345) | 182 (360) 188 (370) | 185 (365) 197 (386) | 195 (383) 207 (405) | 238 (460) 252 (487) |
| Vapor Pressure mm Hg@38 °C. (100° F.) | 14 | 6.2 | 5.7 | 5.2 | 3.1 |

Parameters such as drying rates, fire risk, workplace air quality and volatile organic compound emissions will also play a role in the selected non-solvent choice.

In addition, in a commercially acceptable product, odor masking materials or perfumes are often added. Such odor masking materials or perfumes can include terpenes to impart a clean, fresh odor.

The washout solvent components can be varied but a suitable composition would be as follows: about 7.5–20% by volume of at least one terpenyl ester and preferably a mixture of terpenyl esters, about 7.5–20% by volume of a first co-solvent capable of dissolving the top protective cover layer of the flexographic plate, about 0.5–7.5% by volume of a second co-solvent capable of acting as a stabilizer and preventing the solvents from separating and the remainder non-solvent and optionally less than about 2% by volume of a perfume or odor masking material. A preferred composition would be about 10–15% by volume of at least one terpenyl ester and preferably a mixture of terpenyl esters, about 10–15% by volume of a first co-solvent capable of dissolving the top protective cover layer of the flexographic plate, about 0.5–5.0% by volume of a second co-solvent capable of acting as a stabilizer and preventing the solvents from separating and the remainder non-solvent. In a particularly preferred composition the first co-solvent is benzyl alcohol, the second suitable co-solvent is alpha terpineol and the non-solvent is an isoparaffinic hydrocarbon.

The terpene ester-based solvents may be substituted for the synthetic hydrocarbon, oxygenated solvents or halogenated hydrocarbon solvents used heretofore for processing photopolymer printing plates. For example, the terpene ester solvents excel in the processing of photopolymer printing plates based on block copolymers of styrene and butadiene (SBS) or styrene and isoprene (SIS), copolymers of butadiene and acrylonitrile, terpolymers of butadiene, acrylonitrile and acrylic acid and other similar photopolymers. The terpene ester-based solvents can be applied to the plates by any conventional application means including spraying, brushing, rolling, dipping (immersing) or any combination thereof. The terpene ester solvents also, surprisingly, produce photopolymer plates with less cured polymer image swelling than those processed in conventional hydrocarbon or chlorinated hydrocarbon solvents. Since swelling tends to distort the image formed, this surprising result permits clear, sharp images to be formed at much lower exposure times than those resulting from the use of conventional solvents. Additionally, the solvents of the invention have fairly low volatility which reduces worker exposure during plate processing. Furthermore, because terpene esters are natural products, they are much less toxic and are more readily biodegradable than synthetic hydrocarbon or chlorinated hydrocarbon solvents.

It was also surprising to discover that when isoparaffinic hydrocarbons having flash points above 120° F. such as Exxon's ISOPAR L are used instead of high flash point hydrotreated naphthinics such as hydrotreated Shell 142 solvent, the drying time of the photopolymerizable plate was reduced by more than 50%. This reduction in drying time is very significant because high volume flexographic platemakers are usually production limited by the rate at which plates can be dried.

The use of isoparaffinic solvents as the non-solvent base of the washout solvent of the invention has other benefits over that of traditional aliphatic or naphthinic distillates in the same boiling ranges.

(1) Less energy is used when drying the plates. Also, less energy used to distill or reclaim the solvent for reuse. The isoparaffinic solvents normally have lower latent heats of vaporization.

(2) Isoparaffinic solvents exhibit less swelling of rubber or elastomer seals and hosing.

(3) Isoparaffinic solvent exhibit lower odor characteristics than the odor characteristics of traditional aliphatic distillates.

(4) Isoparaffinic solvents, with purity approaching that of U.S.P. White Oil, are less irritating to the skin than traditional aliphatic solvents.

EXPERIMENTAL PROCEDURES

In all of the following examples, 0.067 inch thick photopolymer plates (polymers as described) were processed using the following TME solvent blend of terpinyl acetate (50% by weight), fenchyl acetate (30% by weight) and linalyl acetate (20% by weight). The photopolymer developing solvent as tested includes the above-listed TME blend (12.5% by volume), benzyl alcohol (12.5% by volume), hydrotreated 142° F. flash point mineral spirits (74% by volume) and alpha terpineol (1% by volume). In the tests, the flexographic printing plate was first pre-exposed uniformly from the back in a Polimero AO (type HP 400 EXPO) exposure unit for 8 seconds, then exposed imagewise for 6 minutes by a photographic negative placed on the protective layer and developed with 20 liters of washout solvent as described above at 80 degrees F. in a Starflex 860B.LF dual brush rotary flexographic plate washout unit. The washout time used to determine the washout rate was 5 minutes. Washout rate as determined herein is the amount of unexposed photopolymer plate removed during the plate development process measured in inches divided by the time used to develop the plates (5 minutes) giving a rate in inches per minute. In the examples below, the swelling in terms of thickness was determined, in percent, using a dial indicating micrometer. The quality of the sidewall structure of the image elements was assessed visually with the aid of a microscope. The criteria employed to determine quality of the sidewall structure were steepness of the sidewalls, degree of undermining of the sidewalls and degree of rounding of the relief edges.

EXAMPLE 1

Development of Styrene-Isoprene (SIS) Plates Using TME Based Solvent Blend

Photopolymer plates based on a block copolymer of styrene and isoprene were processed using the terpene ester based solvent blend described above. The washout rate was determined to be 0.0034 inches per minute. The sidewall structure of the image elements was satisfactory, and rounding of the relief edges and undermining of the sidewalls was not observed. The swelling in terms of the thickness was 7.5%. The flexographic printing plate was dried for 100 minutes at 140 degrees F. in a vented dryer until the plate thickness returned to 0.067 inches.

EXAMPLE 2

Development of Butadiene-Acrylonitrile Plates Using TME Based Solvent Blend Photopolymer plates based on a block copolymer of butadiene and acrylonitrile were processed using the terpene ester based solvent blend described above. The washout rate was determined to be 0.0040 inches per minute. The sidewall structure of the image elements was satisfactory, and rounding of the relief edges and undermining of the sidewalls was not observed. The swelling in terms of the thickness was 7.5%. The flexographic printing plate was dried for 80 minutes at 140 degrees F. in a vented dryer until the plate thickness returned to 0.067 inches.

EXAMPLE 3

Development of Terpolymer Plates Using TME Based Solvent Blend

Photopolymer plates based on a block terpolymer of butadiene, acrylonitrile and acrylic acid were processed using the terpene ester based solvent blend described above. The washout rate was determined to be 0.0038 inches per minute. The sidewall structure of the image elements was satisfactory, and rounding of the relief edges and undermining of the sidewalls was not observed. The swelling in terms of the thickness was 10.4%. The flexographic printing plate was dried for 90 minutes at 140 degrees F. in a vented dryer until the plate thickness returned to 0.067 inches.

EXAMPLE 4

Development of Styrene-Butadiene (SBS) Plates Using TME Based Solvent Blend Photopolymer plates based on a block copolymer of styrene and butadiene were processed using the terpene ester based solvent blend described above. The washout rate was determined to be 0.0034 inches per minute. The sidewall structure of the image elements was satisfactory, and rounding of the relief edges and undermining of the sidewalls was not observed. The swelling in terms of the thickness was 7.4%. The flexographic printing plate was dried for 10 minutes at 140 degrees F. in a vented dryer until the plate thickness returned to 0.067 inches.

EXAMPLE 5

Comparison of Isoparaffinic and Hydrotreated Naphthinic Solvents

The drying times of the following flexo plate washout formulations were compared in a commercial, high volume, platemaking facility:

| Formulation 1 | | Formulation 2 | |
|---|---|---|---|
| Component | Weight Percent | Component | Weight Percent |
| Terpene Mixed Esters* | 13.3% | Terpene Mixed Esters* | 13.9% |
| Hydrotreated hydrocarbons** | 69.0% | Isoparaffinic hydrocarbons** | 71.0% |
| Benzyl Alcohol*** | 15.4% | Benzyl Alcohol*** | 12.8% |
| Alpha Terpenol**** | 2.3% | Alpha Terpenol | 2.3% |

*The terpene mixed esters is the mixture of terpinyl acetate (50% by weight), fenchyl acetate (30% by weight) and linalyl acetate (20% by weight) described above.
**The hydrotreated hydrocarbon is Shell 142 HT and the isoparaffinic hydrocarbon is Exxon Isopar L.
***The benzyl alcohol is Bayer photograde.
****The alpha terpinol acts as a co-solvent to keep the components from separating.

| Plate Mfg. | Style | Gauge | Washout Time | Drying Time Formula 2 | Drying Time Formula 1 |
|---|---|---|---|---|---|
| DuPont | PLS | .067 | 475 seconds | 25 minutes | 150 minutes |
| DuPont | DPS | .067 | 475 seconds | 18 minutes | 150 minutes |
| DuPont | DPS | .067 | 475 seconds | 40 minutes | 150 minutes |
| DuPont | TDR | .250 | 1000 seconds | 70 minutes | 250 minutes |
| DuPont | DPS | .045 | 425 seconds | 40 minutes | 90 minutes |
| DuPont | DPS | .045 | 425 seconds | 40 minutes | 90 minutes |
| DuPont | DPS | .067 | 475 seconds | 40 minutes | 150 minutes |
| Polyfibron | Epic | .107 | 525 seconds | 75 minutes | 180 minutes |
| Polyfibron | Epic | .107 | 525 seconds | 80 minutes | 180 minutes |
| Polyfibron | Epic | .107 | 625 seconds | 100 minutes | 180 minutes |
| Polyfibron | Epic | .107 | 525 seconds | 80 minutes | 180 minutes |
| Polyfibron | Epic | .107 | 525 seconds | 80 minutes | 180 minutes |
| Polyfibron | Epic | .107 | 525 seconds | 80 minutes | 180 minutes |

EXAMPLE 6

Numerous plates of manufacturers brand and style were run in a second high volume plate making facility to compare the drying time of Formula 2 using an isoparaffinic non-solvent versus Formula 1 using an aliphatic distillate as the non-solvent in the washout solution of the invention.

In the second high volume platemaking test facility, the criterion for a dry plate was when the print height of the plate had returned to within 0.0005 inches of its original gauge or thickness. In many cases it was found that the original non-processed plate material had variances at least this large. It became apparent that all plates should be inspected prior to developing for initial gauge of the material before processing to be able to use this tight drying gauge tolerance at this facility.

| Plate Mfg. | Style | Gauge | Formulation 1 Drying Time | Formulation 2 Drying Time |
|---|---|---|---|---|
| Polyfibron | EPIC | .067 | 180 minutes | 90 minutes |
| Polyfibron | EPIC | .067 | 180 minutes | 70 minutes |
| Polyfibron | EPIC | .067 | 180 minutes | 75 minutes |
| DuPont | PLS | .067 | 240 minutes | 80 minutes |
| DuPont | PLS | .067 | 240 minutes | 110 minutes |
| DuPont | PLS | .067 | 240 minutes | 95 minutes |
| DuPont | HOS | .107 | 270 minutes | 160 minutes |
| DuPont | HOS | .107 | 270 minutes | 160 minutes |
| DuPont | TDR | .250 | 300 minutes | 165 minutes |

-continued

| Plate Mfg. | Style | Gauge | Formulation 1 Drying Time | Formulation 2 Drying Time |
|---|---|---|---|---|
| DuPont | TDR | .250 | 300 minutes | 135 minutes |
| DuPont | TDR | .250 | 300 minutes | 155 minutes |

Formulation 2 with isopariffinic solvent as the non-solvent reduced drying times on these commercially run printing plates by 30–55%. The washout or developing times used to process the above plates were identical regardless of formulation. Drying times of formulation 1 were established as the average drying time over a six month history.

While the invention has been described in connection with certain preferred embodiments, it is not intended to limit the scope of the invention to the particular forms set forth, but, on the contrary, it is intended to cover such alternatives, modifications, and equivalents as may be included within the spirit and scope of the invention as defined by the appended claims.

What is claimed is:

1. A method for the development of photopolymerizable flexographic relief printing plates comprising the steps of:

selecting a developing solvent, said developing solvent comprising at least one terpene ester;

washing an exposed flexographic relief printing plate with said developing solvent to develop the image by dissolving and washing away the non-exposed photopolymerized layer; and drying the flexographic relief printing plate to remove the developing solvent.

2. The method of claim 1, wherein the printing plate is a styrene-isoprene-styrene plate.

3. The method of claim 1, wherein the printing plate is a butadiene-acrylonitrile plate.

4. The method of claim 1, wherein the printing plate is a butadicne-acrylonitrile-acrylic acid block terpolymer plate.

5. The method of claim 1, including the step of selecting the terpene ester from the group consisting of terpinyl acetate, terpinyl formate, isobornyl acetate, isolornyl formate, fenchyl acetone, linalyl acetate, citronellyl acetate, geranyl acetate, and mixtures thereof.

6. The method of claim 1 wherein the developing solvent further comprises a co-solvent.

7. The method of claim 1 wherein the developing solvent further comprises a non-solvent.

8. The method of claim 1 wherein the developing solvent further comprises a co-solvent and a non-solvent.

9. The method of claim 8, including the step of selecting the co-solvent from the group consisting of n-butanol, 2-ethoxyethanol, benzyl alcohol, ethanol, methanol, propanol, alpha terpineol, dipropylene glycol methyl ether, 2-butoxyethanol, isopropyl alcohol, 2(2-butoxyethoxy) ethanol and mixtures thereof.

10. The method of claim 8, including the step of selecting the non-solvent from the group consisting of mineral spirits, aliphatic petroleum distillates, naphthas, paraffinic solvents, hydrotreated petroleum distillates, mineral oil, ligroin, decane, octane, hexane and mixtures thereof.

11. The method of claim 5, wherein at least one of the terpene esters is a terpinyl ester.

12. The method of claim 8, wherein the terpinyl ester is terpinyl acetate.

13. The method of claim 6 wherein the terpene ester composes a mixture of at least two terpene esters.

14. The method of claim 6 wherein the developing solvent further comprises an odor masking material or perfume.

15. The method of claim 14 wherein the odor masking material is a terpene.

* * * * *